United States Patent [19]

Neale

[11] 4,174,521
[45] Nov. 13, 1979

[54] PROM ELECTRICALLY WRITTEN BY SOLID PHASE EPITAXY

[75] Inventor: Ronald G. Neale, Indian Harbour Beach, Fla.

[73] Assignee: Harris Corporation, Melbourne, Fla.

[21] Appl. No.: 893,930

[22] Filed: Apr. 6, 1978

[51] Int. Cl.$^2$ .................... G11C 11/36; H01L 21/20
[52] U.S. Cl. ..................................... 357/45; 29/584;
148/1.5; 148/175; 357/2; 357/15; 357/67;
365/105
[58] Field of Search ................ 29/584; 357/1, 2, 45,
357/59, 67; 365/94, 103, 163, 173, 105; 148/1.5

[56] References Cited

U.S. PATENT DOCUMENTS

| | | | |
|---|---|---|---|
| 3,413,157 | 11/1968 | Kuiper | 357/20 |
| 3,525,146 | 8/1970 | Hayashida et al. | 357/67 |
| 3,877,049 | 4/1975 | Buckley | 357/67 |
| 3,918,032 | 11/1975 | Nicolaides | 357/2 |
| 4,012,235 | 3/1977 | Mayer et al. | 148/188 |

OTHER PUBLICATIONS

Pretorius et al., Applied Physics Letters, vol. 29, No. 9, Nov. 1, 1976, pp. 598-600.
Feldman et al., Journal of Non-Crystalline Solids (2), (1970), pp. 82-90.
Brodsky et al., IBM Technical Disclosure Bulletin, vol. 13, No. 11, Apr. 1971, P3223.

*Primary Examiner*—William D. Larkins
*Attorney, Agent, or Firm*—Leitner, Palan, Martin & Bernstein

[57] ABSTRACT

A memory cell, having a doped amorphous silicon layer, is formed on a thin layer of silicon alloy which is on a single crystal silicon substrate. The cell is programmed by applying a voltage between a surface contact and the substrate to cause a crystal column to form in the amorphous layer between the substrate and the contact by solid-phase epitaxial growth. A diode is formed between the contact and the substrate by the selection of impurity levels and conductivity type of the amorphous layer and substrate and the selection of the silicon alloy. The cross-sectional area of the column is selectable to provide a multi storage level cell.

36 Claims, 9 Drawing Figures

FIG. 6
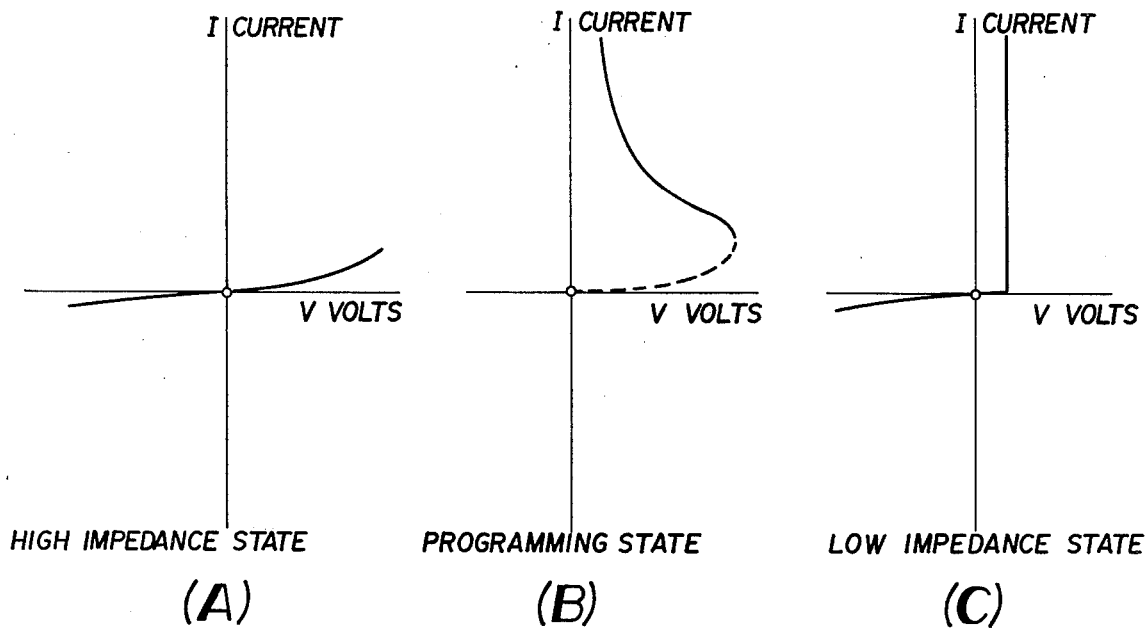
(A) HIGH IMPEDANCE STATE
(B) PROGRAMMING STATE
(C) LOW IMPEDANCE STATE
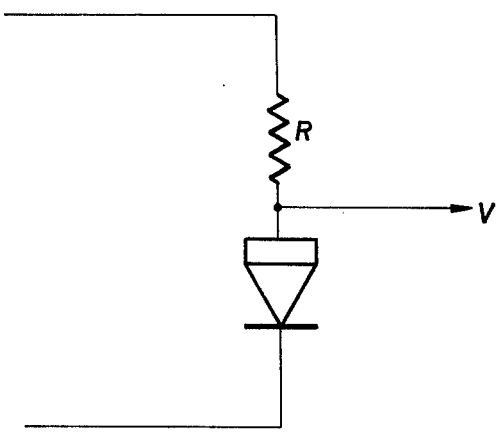
FIG. 7

PROM ELECTRICALLY WRITTEN BY SOLID PHASE EPITAXY

BACKGROUND OF THE INVENTION

Field of the Invention

The present invention relates generally to memory devices and more specifically to a programmable read-only memory structure (PROM) and method of operation.

With the advent of the use of elements was switching devices and more specifically as a memory cell, interest was developed in the use of amorphous semiconductive layers as switching and memory elements. "Switching In Elemental Amorphous Semiconductors" by Charles Feldman and Kishin Moorjani, in the Journal of Non-Crystalline Solids 2, (1970), pages 82-90, reports the ability of amorphous forms of silicon and geranium to operate as switching devices equivalent to the semiconductor glasses. The incorporation of this principle as memory elements described in "Read-Only Store Memory Element" by M. H. Brodsky, R. C. Dockerty and K. Weiser, IBM Technical Disclosure Bulletin, Vol 13 No. 11, Apr. 11, 1971 on page 3223. The Brodsky et al disclosure increases the local temperature to a point where the diffusant or alloy material diffuses into and-/or alloys with the amorphous film to create additional conductive paths in the silicon in addition to the crystallization of the amorhpous semiconductor. This disclosure produces a polycrystalline structure which is difficult to control so as to reproduce reliably because of the diffusing or alloy mechanism. Thus there exists a need to provide a structure and a mechanism which will allow the use of semiconductor amorphous films as reproducible memory storage elements in a read-only memory structure.

Recent research has shown that epitaxial layers of silicon can be grown on single-crystal silicon substrates from an amorphous silicon layer by means of a solid state reaction. This solid-phase epitaxial growth (SPEG) of silicon is reported in "Dissociation Mechanism For Solid-Phase Epitaxy of Silcion in the Si (100)/Pd$_2$ Si/Si (amorphous) System"; R. Pretorius, Z. L. Liau, S. S. Lau and M. A. Nicolet, Applied Physics Letters, Vol. 29, No. 9, Nov. 1, 1976, Pages 598-600. The present invention uses the SPEG mechanism in a memory structure similar to that described by Brodsky et al to provide a memory element which is most reproducible because of the epitaxy and capable of storing multiple signal levels.

SUMMARY OF THE INVENTION

The memory cell of the present invention includes a single crystal semiconductor substrate, a first layer of a metallic alloy of the semiconductor material, a second doped amorphous layer of the semiconducted material and a contact layer on said amorphous layer. The memory element is programmed by applying a voltage across the substrate and the contact layer of a sufficient magnitude and duration to cause solid-phase epitaxial growth of a single crystal column in the amorphous layer between the substrate and the contact layer. The solid-phase epitaxial growth causes a portion of the alloy layer to be transferred from the interface between the substrate and the amorphous layer to the interface between the column and the contact layer. The cross-sectional area of the column is a function of the voltage applied and the duration such that the memory cell may store varying levels or states. Since the column structure is irreversible, the cross-sectional and consequently the stored level may only be increased once created. By proper selection of the alloy layer and the impurity conductivity type and concentration, various types of diode barriers are formed. If the amorphous layer and the substrate are of opposite conductivity type, the column formed will produce a PN junction with the substrate. If the substrate and the amorphous layer are of the same conductivity type, the impurity concentration in the amorphous layer and the alloy is selected to produce a Schottky barrier between the alloy layer and the single crystal column formed in the amorphous layer. A transistor may also be formed wherein a region is formed in the substrate of opposite conductivity type from the substrate and the amorphous layer is formed of the same conductivity type as the substrate on the opposite conductivity type region in the substrate. Preferrably, the substrate and amorphous layer are silicon and the alloy is palladium silicide.

OBJECTS OF THE INVENTION

An object of the present invention is to provide a programmable read-only memory using amorphous silicon and programmed into a single crystal structure.

Another object of the invention is to provide a programmable read-only memory using an amorphous semiconductor material which is programmed by solid-phase epitaxial growth.

A further object of the invention is to provide a programmable read-only memory which is capable of a plurality of states.

An even further object is to provide an amorphous PROM capable of integration with conventional silicon devices and technology.

A still further object is to provide an amorphous PROM capable of integration as matrices with driver and decoder circuits.

Other objects, advantages, and novel features of the invention will become apparent from the following detailed description of the invention when considered in conjunction with the accompanying drawings.

BRIEF DESCRIPTION OF THE DRAWINGS

FIGS. 6A, B, C, are graphical illustrations of the voltage current curve for the different states of the device of FIG. 1.

FIG. 7 is a schematic of a circuit configuration using the device of FIG. 1.

DESCRIPTION OF THE PREFERRED EMBODIMENTS

Figure 1:
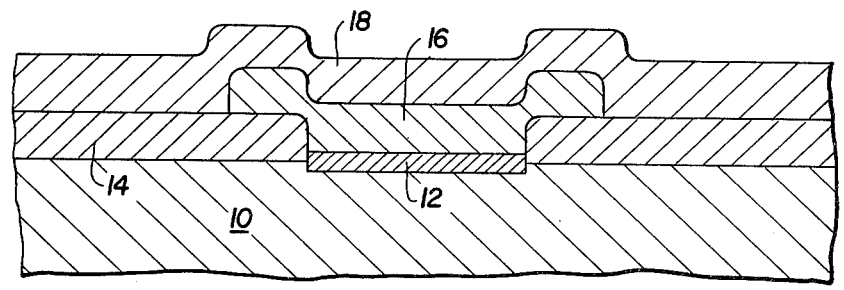
FIG. 1 is a cross-sectional of a PROM structure incorporated in the principles of the present invention.

FIG. 1, which illustrates the preferred embodiments of the storage cell of the present invention, shows a semiconductor substrate 10 with a semiconductor alloy layer 12 and an insulative layer 14 thereon. An amorphous semiconductor layer 16 is formed on the alloy layer 12 and a portion of insulative layer 14 and a contact layer 18 is formed on the amorphous layer 16. The alloy layer 12 and the amorphous layer 16 are semiconductor layers of the same semiconductor material as the substrate 10. In the preferred embodiments, the substrate 10 is a single crystal silicon, the alloy layer 12 is palladium silicide, amorphous layer 16 is amorphous silicon and the contact layer 18 is aluminum.

Figure 2:
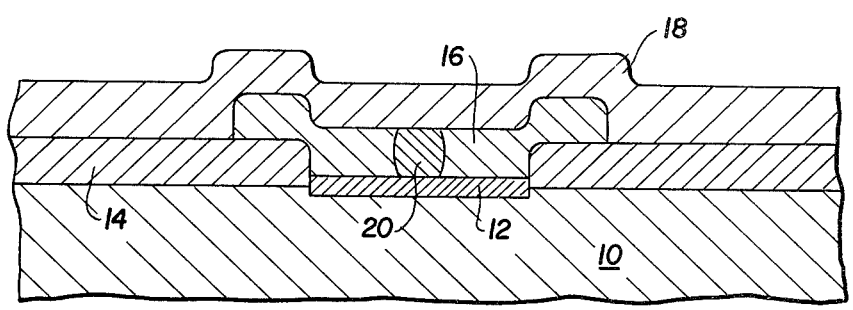
FIG. 2 is a cross-section of the device of FIG. 1 during programming.

The structure of FIG. 1 basically forms an amorphous silicon switch which is capable of being programmed from the high impedance states illustrated therein to a low impedance state. The mechanism used to program the amorphous layer 16 is the SPEG mechanism described in the Pretorius et al article. A high voltage, depending upon the thickness of the amorphous silicon layer 16, is impressed between the contact layer 18 and the substrate 10. A hot channel 20 develops therein as illustrated in FIG. 2 and the amorphous layer in the hot channel goes through a negative resistance transition as illustrated in FIGS. 6A and B. The temperature developed in the hot channel is between 400 and 1200 degrees centigrade.

Because of the high free energy of the amorphous silicon compared to the silicon substrate, the alloy layer of palladium silicide therebetween disassociates and is transported through the hot channel of the amorphous layer. As the palladium is transported, a single crystal column is formed in the amorphous silicon by solid phase epitaxial growth.

Figure 3:
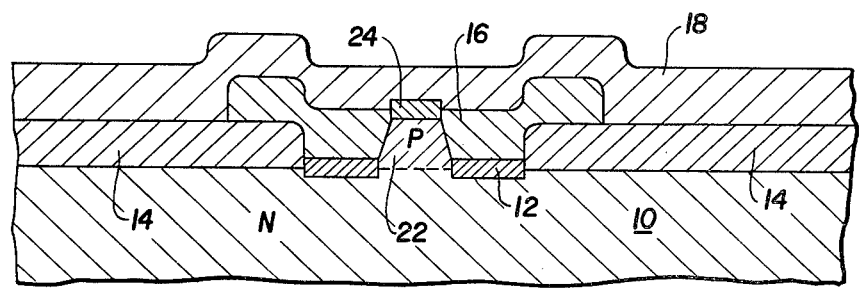
FIG. 3 is a cross-section of the device of FIG. 1 programmed into a low impedance state forming a PN diode.
Figure 4:
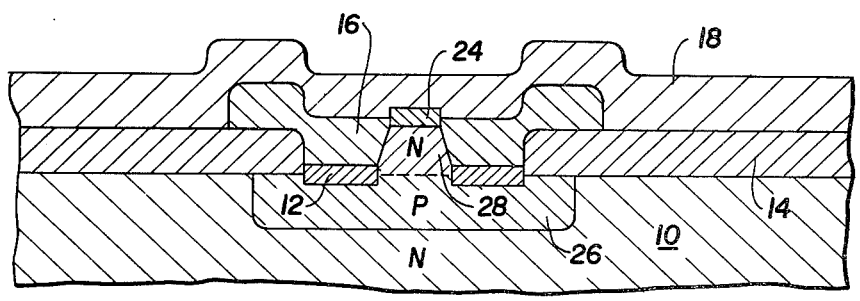
FIG. 4 is a cross-section of the device of FIG. 1 programmed in the low impedance state having a PN junction forming a transistor.
Figure 5:
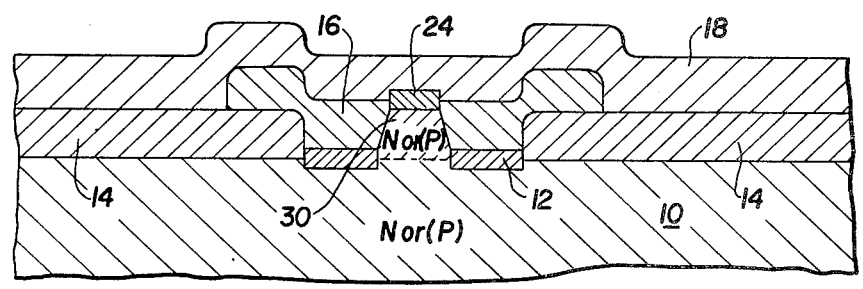
FIG. 5 is a cross-section of the device of FIG. 1 programmed to the low impedance state forming a Schottky diode.

As illustrated in FIG. 3, the substrate 10 may be of a first conductivity type, for example, N-type and the amorphous layer is doped with impurities of a second conductivity type, for example, P-type. A single crystal column 22 formed provides a PN junction diode between the column 22 and the substrate 10. The palladium silicide layer 12 below the column 22 has been transported to the top of the element forming a palladium silicide contact 24 with the aluminum contact 18. Alternatively, a P type region 26 may be formed in an N type substrate 10 and the amorphous layer may be doped with N type impurities to form a column 28 as illustrated in FIG. 4. Thus the programmed state of FIG. 4 will produce a transistor. Also the conductivity type of the substrate 10 and the amorphous layer 16 may be the same, as illustrated in FIG. 5, producing the programmed column 30. The resistivity of the amorphous layer 16 and of the resulting single crystal column 30 is sufficiently high that a Schottky barrier is formed between the column 30 and the palladium silicide contact 24. For example, if the conductivity type of the column 30 is N type, the resistivity should be 0.1 ohm-centimeter and above.

The formation of the structure of FIG. 1 commences with the masking and delineation of the insulation layer 14 to define the location of the storage devices on substrate 10 and the formation of the palladium silicide layer 12 on the exposed portions of the substrate. The amorphous layer 16 is applied by, for example, having appropriate conductivity type and concentration of impurities doped therein. Contact metal layer 18 is formed, for example, by evaporation to complete the structure. The palladium silicide layer 12 may be formed by applying a layer of palladium on the substrate 10 and subsequently forming the amorphous silicon layer 16 thereover. This structure is annealed at between 200 and 400 degrees centigrade such that the palladium reacts both with the substrate and the amorphous layer to form palladium silicide.

The PROM of the present invention uses the SPEG mechanism to create in a switchable amorphous layer a single crystal column. For the SPEG mechanism to operate, (a) the substrate or first layer 10, the semiconductor alloy layer 12 and the amorphous semiconductor layer 16 must be of the same semiconductor material and preferably the first layer 10 be single crystal; (b) the free energy level of the amorphous layer must be sufficiently higher than the free energy level of the first layer; and (c) the amorphous layer must be capable of switching states and crystalizing. The use of silicon and palladium silicide is an example of a working model. Other alloys and semiconductor materials capable of SPEG may be used. Germanium with an appropriate alloy may be an alternative.

Although the base layer 10 has been described as a substrate, the base layer may be a layer of single crystal semiconductor material formed on a substrate.

The characteristics of the switch of FIG. 1 is illustrated in FIGS. 6A, B, and C. The high impedance stage is illustrated in FIG. 6A. With the voltage impressed across the amorphous semiconductor layer, the layer goes through a negative resistance transition as illustrated in FIG. 6B and a hot conducting channel results. The solid-phase epitaxial growth of single crystal silicon amorphous silicon stops when all the amorphous silicon has been consumed and the silicide layer appears at the top of the amorphous device. The characteristic of the device with the column is illustrated in FIG. 6C. Schematic of the resulting structure, for example, of FIG. 3 is illustrated in FIG. 7 as a diode.

The cross-sectional layer of the single crystalline column grown in the amorphous layer is a function of the voltage level and duration. Since the column represents an ON state, compared to the OFF state of no column in the amorphous layer, the resistance value of the column varies inversely to the cross-sectional area of the column. Thus the present device provides, with the variation of column cross-sectional area, a multiple storage level device. Since the column formed is nonreversible, the level of the ON state of the device progressively changes to what may be considered a more ON state. With this analog feature, a matrix of these devices can store greater than the two normal levels of storage as well as being further programmed after the store of the initial ON state. This offers greater flexibility then would of been previously available.

From the preceding description of the preferred embodiments, it is evident that the objects of the invention are obtained in that a programmable read only memory is provided which is most reproducible using amorphous semiconductor storage element and programmed by solid-phase epitaxial growth. Although the invention has been described and illustrated in detail, it is to be clearly understood that the same is by way of illustration and example only and is not to be taken by way of limitation. The spirit and scope of this invention are to be limited only by the terms of the appended claims.

What is claimed:

1. A method of producing a PROM element comprising:
    forming a palladium silicide layer on a single crystal silicon substrate;
    forming a layer of amorphous silicon on said palladium silicide layer;

forming a contact layer on said amorphous layer; and applying programming voltage across said contact and said substrate of sufficient magnitude and duration to cause solid-phase epitaxial growth in said amorphous layer of a column of single crystal silicon extending between said substrate and said contact layer.

2. The method of claim 1 wherein the voltage magnitude and duration is selected to determine the cross-sectional dimension of said column.

3. The method of claim 1 wherein the voltage magnitude is sufficiently large to create a temperature in the amorphous layer in the range of 400 to 1200 degrees centigrade.

4. The method of claim 1 wherein the solid-phase epitaxial growth is performed until a layer of palladium silicide is formed between the column and said contact.

5. The method of claim 1 wherein the substrate is of a first conductivity type and said amorphous layer is formed doped with impurities of said first conductivity type.

6. The method of claim 5 including forming a region in the surface of said substrate of a conductivity type opposite said first conductivity type to separate said substrate and the subsequently formed amorphous layer.

7. The method of claim 1 wherein the substrate is of a first conductivity type and said amorphous layer is formed doped with impurities of a conductivity opposite said first conductivity type.

8. A method of fabricating a read only memory comprising:

forming a plurality of discrete regions of palladium silicide on a single crystal silicon substrate;

forming a layer of amorphous silicon on each of said discrete regions of palladium silicide;

forming a contact layer on each of said amorphous silicon layers;

creating a current between said substrate and selected contacts of a sufficient magnitude and duration to cause a column of single crystal silicon to epitaxially grow through said amorphous layer between said substrate and said selected contacts.

9. The method according to claim 8 wherein said substrate is of a first conductivity type, said amorphous layer is formed doped with impurities of a conductivity type opposite said first conductivity type and said epitaxial growth produces a layer of palladium silicide between the selected contacts and the single crystal columns to form an ohmic contact and said single crystal comumn forms a PN junction with said substrate.

10. The method according to claim 8 wherein said substrate is a first conductivity type, said amorphous layer is formed doped with impurities of said first conductivity type, and said epitaxial growth produces a layer of palladium silicide between the selected contacts and the single crystal columns to form a Schottky diode.

11. The method according to claim 8 wherein said substrate is a first conductivity type and said amorphous layer is formed doped with impurities of said first conductivity type, including forming a plurality of regions of second conductivity type opposite said first conductivity type in said substrate, wherein said palladium silicide regions are formed on said second conductivity type regions, and wherein said column, said second conductivity type regions and said substrate forming a bipolar transistor.

12. A semiconductor structure comprising:

a substrate of single crystal silicon;

a first layer of palladium silicide on said substrate;

a second layer of doped amorphous silicon on said first layer;

a third layer of contact material on said second layer;

a column of doped single crystal silicon on said substrate surrounded laterally by said first and second layers; and a fourth layer of palladium silicide between said column and said third layer.

13. The semiconductor structure according to claim 12 wherein said substrate is of a first conductivity type, said column is of a second conductivity type opposite said first conductivity type, and said semiconductor structure is a diode.

14. The semiconductor structure according to claim 12 wherein said substrate is of a first conductivity type, said column is of said first conductivity type, and said semiconductor structure is a Schottky diode formed by said column and said fourth layer.

15. The semiconductor structure according to claim 12 including a region of first conductivity type formed in said substrate between said substrate and said first layer and column, and wherein said substrate and said column are of a second conductivity type opposite said first conductivity type and said semiconductor structure is bipolar transistor formed by said substrate, said region and said column.

16. In a programmable read only memory including a substrate and a plurality of storage locations formed on said substrate having either a first or second logic state, including at least one storage location in each of said logic states;

each storage location having a first logic state comprising a first layer of palladium silicide on said substrate, a second layer of amorphous silicon on said first layer, and a third layer of contact material on said second layer; and each storage location having a second logic state comprising a first, second and third layer as each of said storage locations having a first logic state, a column of doped single crystal silicon extending between said substrate and said third layer and laterally surrounded by said first and second layers, and a fourth layer of palladium silicide between said column and said third layer.

17. The read only memory according to claim 16 wherein said substrate and said column are of the same conductivity type.

18. The read only memory according to claim 16 wherein said column has an impurity concentration sufficiently low to form a Schottky barrier with said fourth layer.

19. The read only memory according to claim 16 wherein said column is of a conductivity type opposite said substrate forming a PN junction therewith.

20. The read only memory according to claim 16 wherein some of said columns have different cross-sectional areas representing discrete levels of the second logic state.

21. A method of programming a programable read only memory having a crystalline substrate of a semiconductor material, and a plurality of spaced storage locations on said substrate, each including an alloy layer of a metal and said semiconductor material on said substrate, an amorphous layer of said semiconductor material on said alloy layer and a contact layer on said amorphous layer comprising:

applying a voltage across said substrate and said contact layer for the location to be programmed of a sufficient magnitude and duration to cause solid-phase epitaxial growth in said amorphous layer of a crystalline column of said semiconductor material extending between said substrate and said contact layer.

22. The method of claim 21 wherein said solid-phase epitaxial growth is performed until a portion of said alloy layer is transferred from its interface with said substrate to an interface between said column and said contact layer.

23. The method of claim 22 wherein the amorphous layer is doped with impurities, the impurity conductivity type and concentration and the alloy are selected to produce a diode between said contact and said substrate in a programmed storage location.

24. The method of claim 23 wherein said amorphous material has sufficiently low impurity concentration and said alloy is selected to form Schottky barrier between said alloy and said column.

25. The method of claim 23 wherein said amorphous material is doped with impurities of a conductivity type opposite the conductivity type of the impurities of said substrate to form a PN junction with the substrate.

26. The method of claim 21 wherein said semiconductor material is single crystal silicon and said alloy is palladium silicide.

27. A method of fabricating and programming a PROM element comprising:

providing a layer of single crystal semiconductor material;
forming an alloy layer of a metal and said semiconductor material on said single crystal layer;
forming an amorphous layer of said semiconductor material on said alloy layer;
forming a contact layer on said amorphous layer; and
applying a programming voltage across said contact layer and said single crystal layer of sufficient magnitude and duration to cause solid-phase epitaxial growth in said amorphous layer of a column of single crystal semiconductor extending between said single crystal layer and said contact layer.

28. The method of claim 27 wherein the solid-phase epitaxial growth is performed until a layer of said alloy is formed between the column and said contact layer.

29. The method of claim 27 wherein said amorphous layer is capable of switching between a high resistance and low resistance state before said solid-phase epitaxial growth occurs.

30. The method of claim 29 wherein said semiconductor is silicon and said alloy is palladium silicide.

31. The method of claim 27 wherein said amorphous layer is doped with impurities and said column forms a junction barrier between said contact layer and said single crystal layer.

32. A semiconductor structure comprising:
a layer of single crystal semiconductor material;
a alloy layer of a metal and said semiconductor material;
a doped amorphous layer of said semiconductor material on said alloy layer;
a contact layer of contact material on said amorphous layer;
a doped single crystal column of said semiconductor material on said single crystal layer surrounded laterally by said alloy and amorphous layers; and
a layer of said alloy between said column and said contact layer.

33. The semiconductor structure of claim 32 wherein said semiconductor material is silicon and said alloy is palladium silicide.

34. In a programmable read only memory including a substrate of a semiconductor material and a plurality of storage locations formed on said substrate having either a first or second logic state, including at least one storage location in each of said logic states;

each storage location having a first logic state comprising a first layer of an alloy of metal and said semiconductor material on said substrate, a second layer of amorphous form of said semiconductor material on said first layer, and a third layer of contact material on said second layer; and each storage location having a second logic state comprising a first, second and third layer as each of said storage locations having a first logic state, a column of doped single crystal form of said semiconductor material extending between said substrate and said third layer and laterally surrounded by said first and second layers, and a fourth layer of said alloy between said column and said third layer.

35. The read only memory according to claim 34 wherein some of said columns have different cross-sectional areas representing discrete levels of the second logic state.

36. The read only memory according to claim 34 wherein said semiconductor material is silicon and said alloy is palladium silicide.

* * * * *

UNITED STATES PATENT AND TRADEMARK OFFICE
CERTIFICATE OF CORRECTION

PATENT NO. : 4,174,521

DATED : November 13, 1979

INVENTOR(S) : Ronald G. Neale

It is certified that error appears in the above-identified patent and that said Letters Patent are hereby corrected as shown below:

Column 1, line 12, delete "elements was" and insert therefor --chalcogenide--.

Column 1, line 13, delete "and more."

Column 1, line 29, delete "amorhpous" insert --amorphous--.

Column 1, line 56, delete "semiconducted" insert --semiconductor--

Column 2, line 46, delete "cross-sectional" insert --cross-section--.

Column 5, line 51, delete "comumn" insert --column--.

Column 7, line 22, after "form" insert --a--.

Signed and Sealed this

Eighteenth Day of March 1980

[SEAL]

Attest:

SIDNEY A. DIAMOND

Attesting Officer

Commissioner of Patents and Trademarks